United States Patent
Lees (10) Patent No.: US 11,263,898 B2
(45) Date of Patent: Mar. 1, 2022

(54) APPARATUS AND METHODS FOR ASSESSING VEHICLES STRADDLED BETWEEN LANES

(71) Applicant: RED FOX I.D. LIMITED, Stubton (GB)

(72) Inventor: Richard Andrew Lees, Cattai (AU)

(73) Assignee: RED FOX I.D. LIMITED, Stubton (GB)

(*) Notice: Subject to any disclaimer, the term of this patent is extended or adjusted under 35 U.S.C. 154(b) by 219 days.

(21) Appl. No.: 16/633,607

(22) PCT Filed: Jun. 28, 2018

(86) PCT No.: PCT/EP2018/067400
§ 371 (c)(1),
(2) Date: Jan. 24, 2020

(87) PCT Pub. No.: WO2019/020306
PCT Pub. Date: Jan. 31, 2019

(65) Prior Publication Data
US 2021/0366275 A1    Nov. 25, 2021

(30) Foreign Application Priority Data

Jul. 25, 2017 (GB) ..................... 1711993

(51) Int. Cl.
*G08G 1/01* (2006.01)
*G08G 1/042* (2006.01)
*G01R 27/26* (2006.01)

(52) U.S. Cl.
CPC ............. *G08G 1/042* (2013.01); *G01R 27/26* (2013.01)

(58) Field of Classification Search
CPC .......... G08G 1/042; G08G 1/015; G08G 1/01; G01R 27/2611
See application file for complete search history.

(56) References Cited

U.S. PATENT DOCUMENTS 6,345,228 B1 * 2/2002 Lees ..................... G08G 1/01
324/236
6,867,709 B1 * 3/2005 Povey .................. G08G 1/042
324/654

(Continued)

FOREIGN PATENT DOCUMENTS

EP    1028404 A2   8/2000
GB    2536028 A    9/2016

(Continued)

*Primary Examiner* — Julie B Lieu
(74) *Attorney, Agent, or Firm* — Jacob M. Ward; Ward Law Office LLC (57) ABSTRACT

A method of assessing whether a vehicle is straddled between lanes (12,14) on a multi-lane carriageway, the method comprising the steps of: a) measuring inductance change values from two adjacent inductive loops (22a, 20b) situated at a loop site, as the vehicle traverses the loop site; b) summing separate logarithms of the inductance change values, or taking a logarithm of the product of the inductance change values, to obtain a value; and c) comparing the value from step (b) against a predetermined threshold value to make a determination as to whether: i) a single vehicle is straddling multiple lanes (12,14), where the value from step (b) is on one side of the predetermined threshold value, or ii) two vehicles are present in adjacent lanes (12,14), where the value from step (b) is on the other side of the predetermined threshold value.

20 Claims, 2 Drawing Sheets (56) References Cited

U.S. PATENT DOCUMENTS

| | | | |
|---|---|---|---|
| 7,324,015 B1 * | 1/2008 | Allen | G08G 1/01 340/933 |
| 7,734,500 B1 * | 6/2010 | Allen | G08G 1/015 705/13 |
| 8,331,621 B1 * | 12/2012 | Allen | G08G 1/015 382/104 |
| 2006/0170567 A1 * | 8/2006 | Dalgleish | G08G 1/042 340/933 |
| 2008/0143555 A1 | 6/2008 | Allen et al. | |
| 2009/0174575 A1 | 7/2009 | Allen et al. | |
| 2017/0358205 A1 * | 12/2017 | Ippolito | G08G 1/02 |
| 2018/0040242 A1 * | 2/2018 | Lees | G08G 1/042 |

FOREIGN PATENT DOCUMENTS

| | | |
|---|---|---|
| WO | 97/29468 A1 | 8/1997 |
| WO | 00/57198 A1 | 9/2000 |
| WO | 2004/032089 A1 | 4/2004 |

\* cited by examiner

APPARATUS AND METHODS FOR ASSESSING VEHICLES STRADDLED BETWEEN LANES

CROSS-REFERENCE TO RELATED APPLICATIONS

This patent application is a United States National Stage of International Patent Application PCT/EP2018/067400, filed on Jun. 28, 2018, which in turn claims priority to Great Britain Patent Application 1711993.4, filed Jul. 25, 2017. The entire disclosures of the above patent applications are hereby incorporated herein by reference.

FIELD

The present invention relates to an apparatus for and methods of assessing a vehicle on a carriageway using inductive loop measurements, particularly estimating:
  i) whether a vehicle is straddled between lanes;
  ii) for a vehicle straddled between lanes, the lateral position of that vehicle relative to the lanes; and
  iii) for a vehicle travelling on the carriageway which does not pass centrally over an inductive loop in the carriageway, the inductance change value that would arise for that vehicle travelling centrally over that inductive loop.

BACKGROUND TO THE INVENTION

Various types of road monitoring apparatus are known, for the purposes of identifying and/or managing traffic congestion, and planning future road infrastructure, amongst others. These apparatuses include overhead sensors, such as laser sensors or video cameras. When a vehicle passes beneath a laser sensor, for example, the laser is interrupted and the vehicle location can be calculated. However, overhead sensors can have reduced accuracy in adverse weather conditions, amongst other drawbacks.

Apparatuses including inductive loops are also known which do not have such disadvantages, and can be buried in the road to detect traffic as it passes over the loop. An example of this type of system is disclosed in EP1028404. However, known inductive loop systems are prone to miscounting the number of vehicles passing by if the vehicles are straddled between two lanes above the loops. This can happen if a vehicle is changing lanes when approaching a junction, for example. This is due to inductive disturbances occurring in adjacent loops, which can result from the passage of two vehicles in adjacent lanes, or from a single vehicle straddling the two lanes.

The geometric mean of the peak inductance change in loops in adjacent lanes can be used to distinguish between one and two vehicle scenarios as above, if evaluated against a calibrated (or predetermined) threshold value. However, this approach does not consistently distinguish between one and two vehicle scenarios to a sufficiently high level of accuracy. In particular, in scenarios where a vehicle is straddled between lanes and positioned closer to one lane than another, the threshold needs to be set to a higher than ideal value. This is required in order to account for various arrangements of vehicles on the carriageway, as well as differently-sized vehicles, and combinations of such vehicles, passing the inductive loops. For example, some heavy vehicles with lower chassis clearance will cause larger combined inductance changes in straddling conditions. This is due to the combined effects of the low chassis height and greater width than other vehicles with comparable chassis height. The existing method must therefore be compromised to include a high threshold to deal with all scenarios. This approach can also require separate tests which are specific to different vehicle types. It can also be difficult to accurately classify vehicles according to type (and sub-type) if they are straddled between lanes over the inductive loops, which can result in less accurate road usage data.

In video camera installations, such as those used for ANPR (Automatic Number Plate Recognition) or speed monitoring, cameras may be provided to monitor each lane of a carriageway. If a vehicle is switching between lanes at the site of a camera installation, it may lie partially outside the field of view of a given camera. This can result in its number plate not being wholly recorded, or other tags on the vehicle not being read. To enable the best selection of camera(s), it is important to have a good estimate of vehicle position at the trigger point.

Many applications also require an estimate of the lateral locations of vehicles as they pass over the loop site for such purposes as camera triggering or association with RFID tags, for example. Vehicles sometimes pass through a toll site between lanes, and an estimate of the lateral vehicle location is needed. Clearly when a vehicle is travelling fully in lane, i.e. directly over a loop, then the location is implied immediately by the location of the loop activated, but vehicles do not always travel centrally a lane. However, an accurate vehicle location is not known when two adjacent loops are activated by a single vehicle travelling between a pair of adjacent loops.

It is an object of the present invention to reduce or substantially obviate the aforementioned problems.

STATEMENT OF INVENTION

According to a first aspect of the present invention, there is provided a method of assessing whether a vehicle is straddled between lanes on a multi-lane carriageway, the method comprising the steps of:
  a) measuring inductance change values from two adjacent inductive loops situated at a loop site, as the vehicle traverses the loop site;
  b) summing separate logarithms of the inductance change values, or taking a logarithm of the product of the inductance change values, to obtain a value; and
  c) comparing the value from step (b) against a predetermined threshold value to make a determination as to whether:
    i) a single vehicle is straddling multiple lanes, where the value from step (b) is on one side of the predetermined threshold value, or
    ii) two vehicles are present in adjacent lanes, where the value from step (b) is on the other side of the predetermined threshold value.

Using an inductive loop apparatus, this method enables a more accurate assessment of whether a given vehicle is straddled between lanes, or whether two adjacent vehicles are present in separate lanes. Using logarithms provides values of more similar magnitude for any given vehicle presenting in different locations between the loops, so that the apparatus can make an assessment for any type of road-going vehicle. The inductive loops in step (a) may be located in neighbouring lanes.

Preferably, where each inductive loop is located in a single lane, a vehicle is determined to be straddling lanes when the value from step (b) is lower than the threshold value. In the same situation, a vehicle is determined to not be straddled between lanes if the value from step (b) is above the threshold value.

Steps (b) and (c) may involve using a calculation substantially equivalent to straddling value=log(ampl1)+log(ampl2)

where ampl1 and ampl2 are measured inductance change values, and the magnitude of straddling value is an indicator of whether the vehicle is straddling lanes.

For brevity, the calculated logarithms may be henceforth be referred to as "log(ampl1)" and "log(ampl2)". Note that the logarithmic values can be established separately and then summed as log(ampl1)+log(ampl2) in step (b), or they may instead be calculated as a single logarithm of the product of the inductance change values, that is log(ampl1*ampl2), which is equivalent to log(ampl1)+log(ampl2). Any other mathematically equivalent operations are also considered to form part of the method, as are any computational approximations of the method.

Any base may be used for the logarithms when determining whether a vehicle is straddled between lanes. This allows for efficient fixed point implementations to be employed on hardware where floating point calculations are expensive. It will be appreciated that the threshold value for determining whether a vehicle is calculated to be straddling is adjusted according the base of the logarithms involved.

The method may include the step of modifying the calculated logarithms with at least one correction term. Steps (b) and (c) may involve using a calculation substantially equivalent to straddling value=log(ampl1)+log(ampl2)+correction where correction is the correction term.

The correction (or refinement) term is based on the offset of the vehicle from the mid-line between the inductive loops. The correction term refines the sum of the logarithms by increasing the range of lateral locations of the vehicle between the loops over which the sum is relatively constant. This is useful in edge cases, where most of the vehicle is located in one lane and the difference between the measured inductance change values is relatively large. In other words, it is possible to accurately evaluate a broader range of lateral positions of the vehicle by keeping the sum relatively constant, and the threshold value does not need to be set higher than ideal when assessing whether a vehicle is straddling lanes. A single calculation can be used to handle transits of all types of vehicle without compromising on the accuracy of the straddling assessment.

The correction term may be derived by: obtaining a ratio of the inductance change value of one inductive loop relative to the inductance change value of the other inductive loop; calculating a logarithm of the ratio; and using a further term to modify the calculated logarithm.

The ratio may be taken as the greater inductance change value divided by the lesser inductance change value. Preferably, correction is calculated using a calculation substantially equivalent to one of the following:

$$\text{correction} = \frac{\log\left(\frac{ampl1}{ampl2}\right)}{factor}$$

$$\text{correction} = \frac{\log\left(\frac{\max(ampl1, ampl2)}{\min(ampl1, ampl2)}\right)}{factor}$$

where factor is a scaling term.

The sum of the logarithms in step (b) is lower at 'extreme' vehicle positions, where a vehicle is straddled between lanes but mainly located in one of the lanes. This occurs relatively non-linearly, but adding correction compensates for this because its value increases for such vehicle positions. This contributes to a more linear relationship, enabling accurate detection of lane straddling over a wider range of lateral distances.

It will be appreciated that the inverse ratio (giving a negative value of equivalent magnitude) could instead be subtracted from the calculated logarithms of step (b) to reach an equivalent value. Alternatively, it may be advantageous to take a logarithm of the ratio regardless of which is larger, and ignore the sign of the resulting value in further operations, equivalent to taking the modulus of the logarithm of the ratio.

Note that, instead of taking a logarithm of the ratio, logarithms may be calculated for the individual inductance change values. The difference between these logarithmic values is then equivalent to the logarithm of the ratio. This is because log(ampl1)−log(ampl2) is equivalent to log(ampl1/ampl2). The choice in particular embodiments will depend on computational complexity and implementation on the equipment used, in order to minimise the time taken for the calculation.

Note also that factor may be related to the lane widths of the carriageway. It will be appreciated that an inverse value of factor may be used as a multiplier for the logarithm of the ratio to achieve the same result, or that a corresponding value of factor may be added/subtracted or otherwise operate on the ratio to give a similar value for correction.

According to a second aspect of the present invention, there is provided a vehicle detection apparatus for assessing whether a vehicle is straddled between lanes on a multi-lane carriageway, the apparatus comprising a loop site including two inductive loops, provided on or in adjacent lanes of the carriageway, a loop controller associated with each inductive loop, each loop controller energising its associated loop, and measuring inductance change values in that loop when the vehicle traverses the loop site; and processing means for receiving the inductance change values from the loop controllers, and adapted to establish a calculated value by:
a) taking logarithms of each inductance change value, and summing the logarithms; or
b) taking a product of the inductance change value, and taking the logarithm of that product;
the processing means being further adapted to compare the calculated value against a predetermined threshold value, and make a determination as to whether the inductance change values relate to:
i) a single vehicle straddling multiple lanes, where the calculated value is on one side of the predetermined threshold value; or
ii) two vehicles present in adjacent lanes, where the calculated value is on the other side of the predetermined threshold value.

The processing means may be further adapted to modify either or both of the logarithms of (a) or (b) with at least one correction term to establish the calculated value. The correction term may include a logarithm of the ratio of the inductance change values.

The inductive loops are preferably situated at substantially similar positions along the carriageway. In other words, the front and rear edges of the inductive loops should be in line. If there are three or more inductive loops at the loop site, the inductive loops may be arranged substantially collinearly across the carriageway.

The lateral edges of each inductive loop may be spaced from the boundaries of the lane it occupies. Each inductive loop may be located substantially centrally within its lane.

The processing means may include data storage means for storing the inductance change measurements.

The apparatus may include one or more features described with respect to the method of the first aspect of the invention.

According to a third aspect of the present invention, there is provided a method of estimating the lateral position of a vehicle substantially straddled between lanes on a multi-lane carriageway, the method comprising the steps of:

a) measuring inductance change values from two adjacent inductive loops situated at a loop site, as the vehicle traverses the loop site;
b) establishing logarithms of the inductance change values;
c) taking the difference between the logarithms of step (b);

thereby obtaining an estimate related to the lateral position of the vehicle on the carriageway.

Steps (b) and (c) may involve using a relationship substantially equivalent to $$location \propto (log(ampl1) - log(ampl2))$$

where ampl1 and ampl2 are measured inductance change values, and location relates to the lateral position of the vehicle on the carriageway.

This allows derivation of vehicle position relative to the mid-line between two inductive loops, as a proportion of the spacing between the loops. This is because the position of a vehicle travelling over a pair of laterally adjacent inductive loops is proportional to the inductance change values of the respective loops. There is an approximately linear relationship between [log(ampl1)−log(ampl2)] and the physical position (location) of a vehicle on the carriageway. The result is scalable to the physical dimensions of the carriageway or components of the carriageway to resolve the position of the vehicle.

Note that since the lanes are generally the same width, and the loops are typically equal in width and central within their respective lanes, the mid-line between the loops normally corresponds to the mid-line between the lanes as well.

For example, if the inductance change values of the two loops are the same, the vehicle is located midway between the loops, straddled symmetrically between lanes. Different inductance change values would mean that the vehicle is offset to one side, that side being the one where a larger inductance change occurs. Using logarithms to scale the inductance change values compensates for large disparities in those values.

The lateral position of a vehicle is important for use in vehicle monitoring techniques, such as ANPR. In order to capture the license plate of a vehicle straddled between lanes, the correct camera needs to be selected. The extent of straddling affects which camera is best placed for this, where there are multiple cameras focused on a set of lanes, or how a given camera can be adjusted to compensate for the straddled position. Similarly, where a vehicle has tags (e.g. radio frequency identification (RFID) tags), the lateral location of a vehicle may be important for reading the tags.

Rather than calculating the difference between the logarithms, log(ampl1)−log(ampl2), a logarithm of the ratio between the inductance change values, log(ampl1/ampl2), may be used, as explained for the ratio in the first aspect of the invention. Therefore, steps (b) and (c) may be performed in a single step. Any other mathematically equivalent operations are also considered to form part of the method, as are any computational approximations of the method which may be used in appropriate circumstances.

Any base can be used for the logarithms when determining the lateral position of a vehicle straddled between lanes. This enables efficient fixed point implementations to be employed on hardware where floating point calculations are expensive.

The method may also include the steps of:

d) combining the logarithms of step (b) to establish a combined value;
e) establishing a ratio of the difference of step (c) to the combined value of step (d).

For step (d), whilst the logarithm values can be calculated separately and then summed, log(ampl1)+log(ampl2), they may instead be calculated as a single logarithm, log(ampl1*ampl2), to reach the same value, as explained with respect to the first aspect of the invention.

Steps (b) to (e) may involve using a calculation based on or substantially equivalent to:

$$location = \frac{log(ampl1) - log(ampl2)}{log(ampl1) + log(ampl2)}$$

where ampl1 and ampl2 are measured inductance change values, and location relates to the lateral position of the vehicle on the carriageway.

In this form, the combined inductive loop activation is represented by the sum of logarithms of the inductance change values. Using this sum in the denominator has the advantage that the value of location is automatically scaled to be a proportion location, i.e. its value relates to the proportion of the vehicle located over one of the loops, as viewed along the length of a lane.

For equal inductance change values, the value of location is 0, indicating the vehicle is half in one lane and half in the other. For an essentially non-straddling vehicle, the value of ampl1 or ampl2 is negligible relative to the other inductance change value. The value of location is then approximately unity (1) or minus unity (−1) depending on which inductance change value is negligible.

The difference of the logarithms in step (c) may be modified by one or more correction terms. The combined value of the logarithms in step (d) may be modified by one or more correction terms. Preferably, one of the correction terms accounts for the lateral spacing between centres of the adjacent inductive loops.

Using correction (or refinement) term(s) gives a more accurate estimate of the vehicle's position, accounting for elements of non-linearity in the relationship between [log(ampl1)−log(ampl2)] and location. The term for the lateral spacing between loops has units of distance, and the same units then apply to the estimate of the lateral location. This provides the lateral position as a physical distance by which a vehicle is offset into one lane whilst straddled, rather than a proportional value.

The correction term may include a term to account for lane widths on the carriageway and may also take into account factors such as the materials used in the road. For example, the degree of refinement needed is different for reinforced concrete including steel rebars than it is for rebar free sites.

Preferably, ampl1 is the greater of the inductance change values and ampl2 is the lesser of the inductance change values. The value of location is then relative to the loop where the greater inductance change value arose.

The relationship may be substantially equivalent to:

location=(log(ampl1)−log(ampl2))
*width$_{factor}$*vehicle_type$_{factor}$ where width$_{factor}$ and vehicle_type$_{factor}$ are correction terms.

The difference in step (c) can be dependent on loop sensitivity and vehicle type, amongst others. If loop sensitivities are not standardised before measuring inductance change values, then scaling factors can be applied to compensate. In this version, width$_{factor}$ and vehicle_type$_{factor}$ are both applied.

A typical value for is vehicle_type$_{factor}$ is for cars where width$_{factor}$ is chosen to scale to the lane width, or around 1.1 to 1.3 for heavy goods vehicles such as trucks. The values of the scaling factors are selected based on characteristics of the inductive loop activation as a vehicle passes over the site, or by using independent sensors to evaluate the vehicles, e.g. overhead sensors or axle sensors.

Smaller/lighter vehicles give rise to a relatively focused activation of the loops, whereas larger/wider vehicles give rise to a more diffuse activation of the loops, giving a smaller difference between inductance change values for a given off-centre location of the vehicle. Hence, an increased scaling factor (vehicle_type$_{factor}$) may be used for vehicles assessed as having a more diffuse effect on the loops, compared to vehicle types that have a more compact influence on the loops.

One particular correction term may be derived by: obtaining a ratio of the inductance change value of one inductive loop relative to the inductance change value of the other inductive loop; calculating a logarithm of the ratio; and using a further term to modify the calculated logarithm.

The ratio may be taken as the greater inductance change value divided by the lesser inductance change value. Preferably, correction is calculated using a calculation substantially equivalent to one of the following:

$$\text{correction} = \frac{\log\left(\frac{ampl1}{ampl2}\right)}{\text{factor}}$$

$$\text{correction} = \frac{\log\left(\frac{\max(ampl1, ampl2)}{\min(ampl1, ampl2)}\right)}{\text{factor}}$$

where factor is a scaling term related to the lane widths of the carriageway (different to width$_{factor}$).

The advantages of this particular correction term are the same as those set out for the first aspect of the invention. Also, by using a maximum to minimum ratio, the vehicle is known to be offset towards the lane having the loop with the greater inductance change value, because the lateral position calculated is the distance from the centre of the vehicle to the mid-line between the loops.

It will be appreciated that an inverse value of factor may be used as a multiplier for the logarithm of the ratio to achieve the same value of correction, or that a corresponding value of factor may be added/subtracted or otherwise used to transform the ratio to establish a similar value for correction.

The calculation may be substantially equivalent to:

$$\text{location} = \frac{(\log(ampl1) - \log(ampl2)) * \text{lane\_width\_multiplier}}{\log(ampl1) + \log(ampl2)}$$

The term lane_width_multiplier relates to the distance between the inductive loops, having units of length. Using it as a multiplier makes location a physical quantity, i.e. the value of location becomes the physical distance by which the centre-line of a vehicle is offset from the mid-line between the two inductive loops. The value of lane_width_multiplier may be half the distance between centres of the inductive loops (or half the width of the lane).

The calculation may be substantially equivalent to:

$$\text{location} = \frac{(\log(ampl1) - \log(ampl2)) * \text{lane\_width\_multiplier}}{\log(ampl1) + \log(ampl2) + (\text{correction} * \text{multiplier})}$$

Inductance variations in the loops occur over a distance greater than the width of a vehicle. As a result, dividing the difference of the logarithms of ampl1 and ampl2 by the sum of the logarithms of ampl1 and ampl2 gives an apparent vehicle location slightly closer to the midpoint between the loops than the actual location of the vehicle. Adding the additional terms to the denominator further refines the accuracy of the estimated location to overcome this.

Having the sum of the logarithms of ampl1 and ampl2 in the denominator actually increases non-linearity between the values for calculated and actual vehicle positions across the carriageway. In particular, the sum decreases where a vehicle is significantly asymmetrically straddled between lanes. The product of the correction and multiplier terms compensates for this by increasing in value at 'extreme' vehicle positions, where the vehicle is straddling lanes but predominantly located in one lane, and being negligible in value for relatively symmetric straddling positions. This in turn minimises the variation between estimated and actual vehicle location for combinations of ampl1 and ampl2 for vehicle positions across the carriageway. The value of multiplier is typically between 1 and 10 to give the best estimate of vehicle position, where correction is calculated as previously described and with factor equal to 3. Clearly, the values of factor and multiplier can be adjusted in a related fashion to achieve the same calculated value.

It may be advantageous to increase the value of the product of correction and multiplier beyond that required for correcting the sum of the logarithms to have relatively constant value for different pairs of ampl1 and ampl2 measurements. This is because a larger correction term in the denominator may compensate for non-linearity of the relationship between log(ampl1)−log(ampl2) and the lateral location of the vehicle, improving the accuracy of the location estimate over a wider range of actual vehicle positions.

The calculation may be substantially equivalent to:

$$\text{location} = \left[\frac{\log(ampl1) - \log(ampl2) + (P * \text{correction})}{\log(ampl1) + \log(ampl2) + \text{correction}}\right] * \text{lane\_width\_multiplier}$$

Similarly to the previous calculation, this calculation improves the accuracy of the estimated vehicle location relative to the actual vehicle location. In this case, this is achieved by adding a proportion (P) of correction to the numerator (or subtracting, when P is negative), rather than using a fixed multiplier value. This is because correction varies with ampl1 and ampl2, so it is an adaptive correction term. A typical value of P is between −1 and 1.

The calculation may be substantially equivalent to one of the following:

$$location = \frac{(\log(ampl1) - \log(ampl2)) * \text{lane\_width\_multiplier}}{\log(ampl1) + \log(ampl2) - \text{width}_{factor}}$$

$$location = \frac{\log(ampl1) - \log(ampl2) - \text{correction}}{\log(ampl1) + \log(ampl2) + \text{correction}}$$

In the second calculation, a proportional value of location is provided. In the second and third calculations, correction may alternatively be used in only the numerator, or only the denominator. The further correction term $width_{factor}$ may depend on the lane widths of the carriageway and/or the materials of the carriageway in the region of the inductive loops, amongst other factors.

For example, the value of $width_{factor}$ may be selected so that, prior to applying lane_width_multiplier, the calculation tends to a limit when a vehicle is not straddled between lanes (i.e. substantially central in a lane), and approaches zero the closer the vehicle is to being straddled equally between lanes.

Different vehicle locations across a pair of lanes will give rise to different estimates of location. The rate at which the value of location changes with lateral location across the lanes can be controlled by reducing the overall value of the denominator, or increasing the overall value of the numerator, relative to the other.

For example, lane_width_multiplier may be set to a value greater than half of the lane width. In another example, the denominator may contain a compensating factor which is subtracted from, or divides, the sum of the logarithms. Control in this manner may be determined according to vehicle type, which can be determined based on, inter alia, the values of ampl1 and ampl2. A larger value of lane_width_ multiplier may be used for heavy goods vehicles, for example.

Vehicle type may be reliably inferred from the characteristics of an inductance measurement such as amplitude, total variation over the scope of the vehicle etc., or the time over which a single inductance change event lasts, for example.

The calculation may be substantially equivalent to:

$$location = \frac{\log(ampl1) - \log(ampl2)}{\log^{-1}\left[\frac{1}{2}(\log(ampl1) + \log(ampl2)) - \log(scale)\right]}$$

Preferably, the calculation is substantially equivalent to:

$$location = \frac{\log(ampl1) - \log(ampl2)}{\frac{1}{scale}\log^{-1}\left[\frac{1}{2}(\log(ampl1) + \log(ampl2) + \text{correction})\right]}$$

This form of normalisation, particularly in the preferred equation directly above, can give a good estimate of lateral vehicle location. It is also less sensitive to different vehicle types, which minimises or avoids the need to identify vehicle type and adjust the estimate of location accordingly.

The value of scale is selected to cause the value of location to tend to 1 for a vehicle travelling completely over one or other of the inductive loops. Its value can be augmented to take account of the physical location of the vehicle, or a form of lane_width_multiplier may be applied. A typical system will use a scale value of around 80 to produce a location value scaled to lane width, or around 25 to produce a proportional output (e.g. see equation 3(c) below). A more precise value for a particular pair of lanes can be arrived at by measuring lateral vehicle positions and comparing with the calculated value for different values of scale.

In the different versions of the calculation above, correction, lane_width_multiplier, multiplier, P, scale and $width_{factor}$ are all correction terms.

Preferably, ampl1 is the greater of the inductance change values and ampl2 is the lesser of the inductance change values. This may be the case when calculating either or both of location and correction.

According to a fourth aspect of the present invention, there is provided a vehicle detection apparatus for estimating the lateral position of a vehicle substantially straddled between lanes on a multi-lane carriageway, the apparatus comprising a loop site including two inductive loops provided adjacent to one another on or in the carriageway, a loop controller associated with each inductive loop, each loop controller energising its associated loop, and measuring inductance change values in that loop when the vehicle traverses the loop site; and processing means for receiving the inductance change values from the loop controllers, and adapted to establish an estimate of the lateral position of the vehicle on the carriageway by:
a) taking logarithms of the inductance change values, and taking a difference of those logarithms; or
b) establishing a ratio of the inductance change values, and taking a logarithm of the ratio.

Preferably, the processing means is further adapted to establish the estimate of lateral position by:
c) combining the logarithms to establish a combined value; and
d) establishing a ratio of the value from (a) or (b) to the combined value.

The processing means may be further adapted to modify the output from (a) or (b), and/or (c), with at least one correction term when establishing the estimate of lateral position.

Preferably, the correction term or terms are based on one or more of the following: a logarithm of the ratio of the inductance change values; the distance between the inductive loops; the distance between centres of the inductive loops; lane widths on the carriageway; materials that form part of the carriageway at the loop site; vehicle type.

The lateral edges of each inductive loop may be spaced from the lateral boundaries of the lane in which that inductive loop is located.

The processing means may include data storage means for storing the inductance change measurements.

The apparatus may include one or more features described with respect to the method of the third aspect of the invention.

According to a fifth aspect of the present invention, there is provided a method of estimating an inductance change value that would arise for a vehicle travelling centrally over a given inductive loop in a carriageway, the method comprising the steps of:

a) measuring inductance change values from two adjacent inductive loops situated at a loop site, as a vehicle traverses the loop site;
b) establishing one or more logarithms of the inductance change values;
c) applying first and second correction terms to the one or more logarithms to establish an estimated inductance change value that would have arisen in one of the inductive loops if the vehicle had travelled substantially centrally over that loop.

In a carriageway, inductive loops can be provided in each lane. When a vehicle is not travelling substantially centrally within a lane, or is straddled between two lanes, the inductance change value in an inductive loop within that lane is less than would otherwise occur. An inductive loop in an adjacent lane can also have a measurable inductance change value caused by such a vehicle. These two 'partial' inductance change values can be transformed using this method to derive an estimate (or expected value) of the peak inductance change value that would result from a vehicle passing substantially centrally over a single inductive loop.

The estimated peak inductance change value is useful for classifying different types of vehicles or estimating vehicle characteristics. For example, it is possible to collect road usage data remotely and then accurately classify vehicles according to size (motorcycles, cars, caravans, lorries etc.) using the theoretical maximum inductance change value. This can give an accurate indication of road usage around junctions where there is a tendency for vehicles to change lanes. Although the required accuracy for most purposes is to within around 20-30%, the estimated theoretical inductance change value is on average accurate to within around 1% of the peak inductance change value actually measured for a given vehicle travelling centrally within a lane.

Preferably, the first correction term is subtracted from the logarithm(s) of the inductance change values. Preferably, the logarithm(s) of the inductance change values are divided by the second correction term. More preferably, the second correction term is applied after the first correction term.

Steps (b) and (c) may involve using a calculation substantially equivalent to:

$$ampl_{inline} = \frac{\log(ampl1) + \log(ampl2) - factor1}{factor2}$$

where ampl1 and ampl2 are measured inductance change values, factor1 and factor2 are correction terms, and $ampl_{inline}$ is an estimated theoretical inductance change value.

A further correction term may applied to the one or more logarithms. The further correction term may be derived by: obtaining a ratio of the inductance change value of one inductive loop relative to the inductance change value of the other inductive loop; calculating a logarithm of the ratio; applying a correction to the calculated logarithm.

The further correction term may be added to the logarithms of the inductance change values. The further correction term may include a term related to the lane widths of the carriageway. The ratio may be taken as the greater inductance change value divided by the lesser inductance change value. Preferably, correction is calculated using a calculation substantially equivalent to one of the following:

$$correction = \frac{\log\left(\frac{ampl1}{ampl2}\right)}{factor}$$

$$correction = \frac{\log\left(\frac{\max(ampl1, ampl2)}{\min(ampl1, ampl2)}\right)}{factor}$$

where factor is a scaling term.

The calculation in steps (b) and (c) may be substantially equivalent to:

$$ampl_{inline} = \frac{\log(ampl1) + \log(ampl2) + correction - factor1}{factor2}$$

The advantages of correction are set out in the description of the first and second aspects of the invention.

The method may further include the step of determining a value of factor2 based on statistics derived from the data gathered from the loop site during use. The same may apply to factor1. The statistics may include the mean and/or standard deviation of the data sets. The mean and/or standard deviation may be based on the raw inductance change value data sets, logarithms of those data sets, and/or calculated values of $ampl_{inline}$ for the data sets.

The method may include the steps of:
i) collecting sets of inductance change values for vehicles travelling substantially in lane during normal traffic conditions on the carriageway;
ii) collecting further sets of inductance change values for vehicles straddled between lanes during normal traffic conditions on the carriageway;
iii) setting an initial value for factor2, and calculating an $ampl_{inline}$ value for each further set of inductance change values; and
iv) using the initial value of factor2 to derive a refined value of factor2 via a calculation substantially equivalent to $$factor2_{n+1} = \frac{sd_{calc}}{sd_{inlane}} * factor2_n$$

where $factor2_n$ is the initial value of factor2 from (iii), $sd_{inlane}$ is the standard deviation of the values in the sets of inductance change values in (i), $sd_{calc}$ is the standard deviation of the $ampl_{inline}$ values from (iii), and $factor2_{n+1}$ is the refined value of factor2.

This can be used to generate a tailored value of factor2 for a given site, and results in a more accurate estimate for $ampl_{inline}$ than using a generic value of factor2.

The method may also include the steps of:
v) calculating logarithms for each set and further set of inductance change values;
vi) using one or more correction terms to modify the logarithms of each set of inductance change values; and
vii) using an initial value of factor1 to derive a refined value of factor1 via a calculation substantially equivalent to $$factor1_{n+1} = \frac{mean_{strad} - ((mean_{strad} - factor1_n) * factor2)}{factor1_n * \frac{mean_{calc}}{mean_{inlane}}}$$

where $factor1_n$ is the initial value of factor1, $mean_{strad}$ is the mean of the values of the modified logarithms in (vi), $mean_{calc}$ is the mean of the $ampl_{inline}$ values from (iii), $mean_{inlane}$ is the mean of the values in the sets of inductance change values in (i), and $factor1_{n+1}$ is the refined value of factor1.

This can be used to generate a tailored value of factor1 for a given site, and results in a more accurate estimate for $ampl_{inline}$ than using a generic value of factor1. The value used for factor2 in this calculation is preferably the refined value established via the previous steps (i) to (iv). Alternatively, a refined value of factor1 may be obtained by performing steps (i) and (ii), calculating $ampl_{inline}$ values as in step (iii), and then performing steps (v) to (vii) using an unrefined (i.e. initial) value of factor2 in step (vii).

Usually, one iteration of the calculation can give a sufficiently accurate refined value. However, multiple iterations of the calculations in (i)-(iv) and/or (v)-(vii) can be performed, using the calculated refined values of factor1 and/or factor2 as new initial values. The statistical data needs to be calculated anew in these cases, using the new initial values.

According to a sixth aspect of the invention, there is provided a vehicle detection apparatus for estimating an inductance change value that would arise for a vehicle travelling centrally over a given inductive loop in a carriageway, the apparatus comprising a loop site including at least two inductive loops provided adjacent to one another on or in the carriageway, a loop controller associated with each inductive loop, each loop controller energising its associated loop, and measuring inductance change values in that loop when the vehicle traverses the loop site; and processing means for receiving the inductance change values from the loop controllers, and adapted to establish an estimate of the inductance change value that would have arisen for one of those inductive loops had the vehicle travelled centrally over that loop by: summing logarithms of the inductance change values, and applying one or more correction terms to the summed logarithms to establish the estimate.

The processing means may be further adapted to apply a further correction term to the logarithms. The further correction term may include a logarithm of the ratio of the inductance change values.

The processing means may be further adapted to use statistics related to the inductance change values to refine the values of the first and/or second correction factors for application to the logarithms. The statistics used are preferably derived from a statistically significant sample of vehicles.

The lateral edges of each inductive loop are spaced from the lateral boundaries of the lane in which that inductive loop is located.

The processing means includes data storage means for storing the inductance change measurements.

The apparatus may include one or more features described with respect to the method of the fifth aspect of the invention.

Where more than two inductive loops are in place across a carriageway, for example where there are more than two lanes, the methods described here are applied to pairs of adjacent loops. In rare cases, where two vehicles are straddling into a common lane, the signatures in the unshared loops are considered first. If one of these is significantly lower amplitude than the other, the lower amplitude signature is likely to be straddling more into the adjacent lane than the vehicle providing the higher unshared signature. The straddle is thus considered to be between the loop with the lower signature and the common loop. The other vehicle is considered to be in lane.

If the amplitudes of the outer signatures are similar in amplitude, then a test of correlation of amplitude versus time between the outer signatures can be made. In most cases the correlation with be poor, in which case the common signature may be deemed as being associated with the outer signature having a better correlation with the common signature, and the other is considered as being in lane.

In the event that the outer signatures correlate well, or that the common loop signature correlates similarly with both of the outer loops, half of the amplitude of the common signature is assessed separately with both of the outer loop signatures, both of the vehicles are determined as straddling, and the locations of the two vehicles is assessed using the outer loop amplitudes and half the common loop amplitude.

In the case of a shared common loop where the outer loop signature correlate poorly, partial correlation between each of the outer loops and part of the common signature may provide an opportunity to separate the common signature into two time disparate components, with each of the components associated with the outer loop signature that correlates well with that component. In this instance, time versus amplitude correlation between each of the outer loop signatures and the common signature is done for the time period occupied by each of the outer signatures only. In cases where a substantial portion of the outer signatures do not overlap in time (such as happens, for example, when two vehicles are merging into a single lane, the most common cause of shared loop signatures), the correlation processes may be limited to the non-overlapping time periods of each of the outer signatures.

BRIEF DESCRIPTION OF THE DRAWINGS

For a better understanding of the present invention, and to show more clearly how it may be carried into effect, reference will now be made by way of example only to the accompanying drawings, in which.

DESCRIPTION OF PREFERRED EMBODIMENTS

Figure 1:
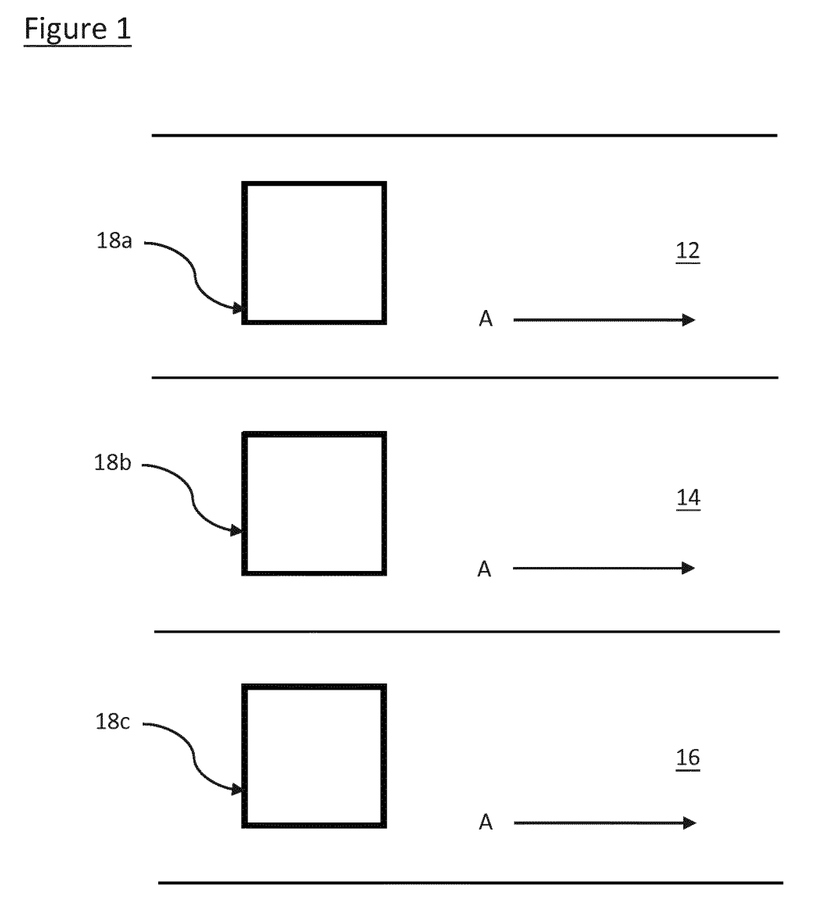
FIG. 1 is a schematic showing the layout of an apparatus having inductive loops for detecting vehicles on a carriageway according to the method of the present invention.

Referring firstly to FIG. 1, a three-lane carriageway is shown. Each lane 12, 14, 16 is for vehicles travelling in the same direction indicated by arrows A. In the following description, references to "length" or "along" the lane refer to the direction indicated by arrows A, and references to "width" or "across" the lane refer to a direction substantially perpendicular to arrows A.

An inductive loop apparatus is provided across the carriageway. The apparatus includes three inductive loops 18a, 18b, 18c. The loops 18a, 18b, 18c are arranged in a row in the respective lanes 12, 14, 16. The stretch of carriageway containing the loops may be considered to form a loop site. It will be appreciated that alternative embodiments may include any number of such rows of loops arranged along the carriageway. It will also be appreciated that the calculations described herein could be applied on all of or any combination of the rows of loops in such an embodiment.

Each loop is energised with alternating current at a selected frequency, allowing the inductance of the loop to be measured. Measurements are taken at a rate which enables accurate vehicle detection taking account of loop length and the speed of vehicles passing over the loops. The frequencies selected for each loop may differ to avoid coupling between loops, or the inductance of each loop may be sampled independently for the same reason.

When a vehicle passes over a loop, the inductance in the loop is generally reduced due to the effect of the conducting materials in the vehicle chassis. The magnitude of the change in inductance (i.e. the inductance change value) depends on the height of the bulk of the vehicle above the loop, and the amount of the loop covered by the vehicle when passing. Vehicles with a high chassis tend to cause a lower drop in inductance as they pass over the loop as compared with vehicles which travel low to the ground. A vehicle which only partially passes over a loop will cause less of a drop in inductance than a vehicle which passes over the full width of the loop.

Each inductive loop 18a, 18b, 18c is positioned substantially centrally in its lane. Each inductive loop 18a, 18b, 18c is substantially square in shape. Each inductive loop 18a, 18b, 18c has a width substantially less than the width of its lane, so that the edges of the loop are spaced from the boundaries of the lane. In other words, each inductive loop 18a, 18b, 18c is positioned with a substantial lateral gap between it and the adjacent loop. The lateral gap is typically 1.6 m. It will be appreciated that other shapes of inductive loop can be used, such as round or rectangular inductive loops, for example.

Figure 2:
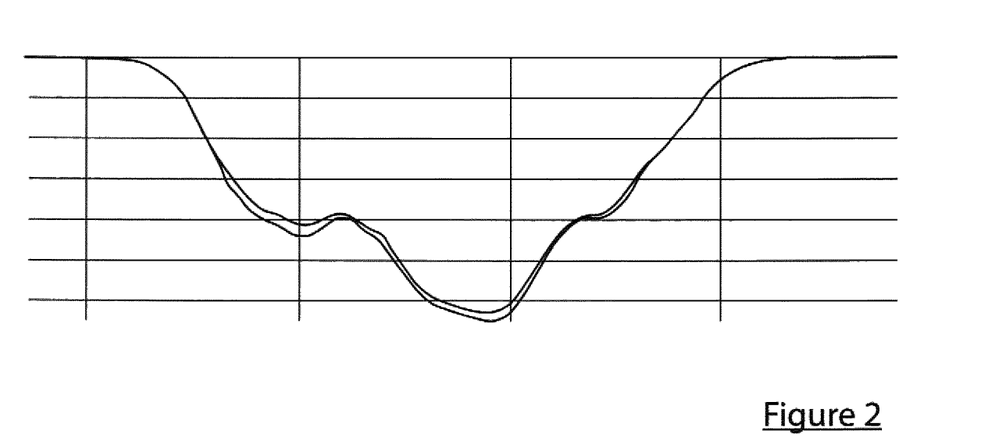
FIG. 2 shows the change in inductance measured in two adjacent inductive loops of the apparatus in FIG. 1, when a vehicle passes substantially centrally between the two loops, that is, straddled between lanes.
Figure 3:
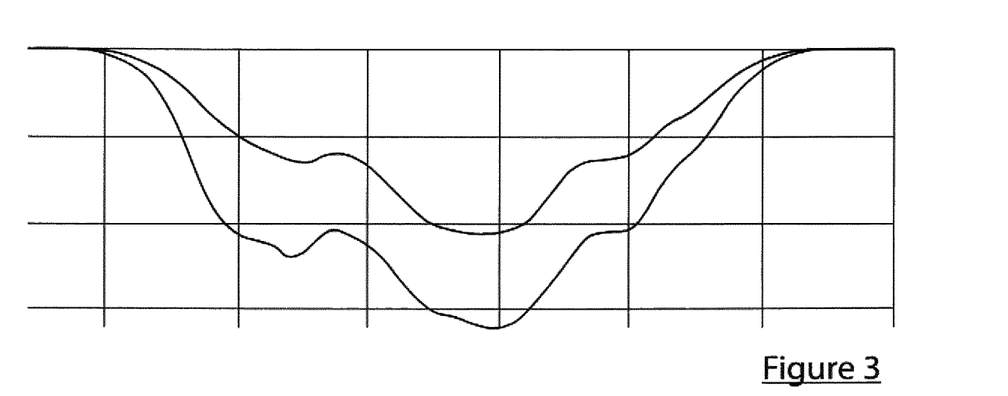
FIG. 3 shows the change in inductance measured in two adjacent inductive loops of the apparatus in FIG. 1, when a vehicle passes somewhat off-centre over the two loops, partially straddled between lanes.
Figure 4:
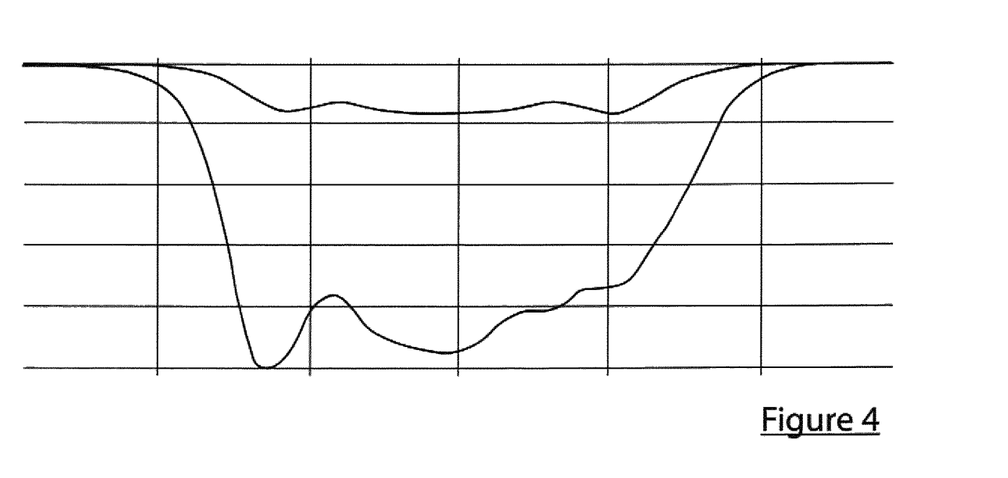
FIG. 4 shows the change in inductance measured in two adjacent inductive loops of the apparatus in FIG. 1, when a vehicle passes over substantially only one of the two loops, and is straddled yet further away from the centre line between lanes.

FIGS. 2, 3, and 4 are illustrative examples of plots of the simultaneous measured inductance of two inductive loops 18a, 18b whilst vehicles pass over the respective loops 18a, 18b at various positions.

In FIG. 2, the vehicle is travelling along and straddled between two lanes 12, 14 substantially centrally, and therefore the pattern of the change in inductance in each loop is substantially similar. It is clear from the measurements that only a single vehicle is passing over the loops 18a, 18b, since the plots are substantially the same shape.

In FIG. 3, a vehicle is again travelling along and straddled between two lanes 12, 14. The shape of the plot from the loops 18a, 18b is substantially identical, but the magnitude is different, indicating the vehicle is partially (or asymmetrically) straddling lanes 12 and 14, i.e. the majority of the vehicle is offset to one lane.

FIG. 4 shows the measured inductance in the loops 18a, 18b of a different type of vehicle passing over them, indicated by the different shape of plot. The vehicle is substantially offset into one lane 12, because there is a much greater inductance drop measured in one loop 18a than in the other loop 18b. This indicates that the vehicle is straddled even more asymmetrically between lanes.

The inductance change value will vary depending on whether or not a vehicle is straddled between lanes, giving a reliable detection means.

Determining Whether a Vehicle is Straddled Between Lanes

It is possible to determine using the inductive loop apparatus whether a vehicle is straddled between lanes 12, 14, 16 using the following equation (1):

$$\text{straddling value} = \log(ampl1) + \log(ampl2) + \text{correction} \quad (1)$$

The value of the correction term above is determined by the following equation (2):

$$\text{correction} = \frac{\log\left(\frac{\max(ampl1, ampl2)}{\min(ampl1, ampl2)}\right)}{factor} \quad (2)$$

ampl1 is the magnitude (or amplitude) of the inductance change value measured as a vehicle passes over a loop in a lane.

ampl2 is the magnitude (or amplitude) of the inductance change value measured as the same vehicle also passes over a loop adjacent to the loop of ampl1 in an adjacent lane.

factor is a value used take account of the width of lanes on a carriageway. A typical value of factor is around 3 for calculating straddling value, but depends on the loop site configuration. Other values greater or lesser than 3 may be used. A good value for factor can be determined experimentally for a particular site geometry by taking measurements with vehicles passing over the loops in varied lateral positions and selecting a value that produces the best correspondence between the physical positions and calculated positions.

straddling value is a value derived from ampl1, ampl2 and correction. It is used for comparison against a predetermined threshold value, in order to determine whether a vehicle is straddled between lanes.

In most cases, ampl1 and ampl2 can be the peak or maximum amplitudes measured in each inductive loop for a given plot (i.e. corresponding to a given inductance change event as one or more vehicles pass over the loops, within a given time frame).

If straddling value is equal to or greater than the predetermined threshold value, then two vehicles are determined as being present in adjacent lanes. If straddling value is less than the predetermined threshold value, then a single vehicle is determined to be straddling two lanes. The threshold value depends on the base of the logarithm used.

For example, the threshold value may be set at 5.1 when using logarithms in base 10. In one scenario, the peak inductance drop over loop 18a in lane 12 is measured as 168. Meanwhile, the peak inductance drop over loop 18b in lane 14 is measured as 110. The value of factor is 3, for example. Therefore, in this case, straddling value is:

$$\log(168) + \log(110) + ([\log(168/110)]/3) = 4.33 \text{ (3 s.f.)}$$

which is below the threshold value, indicating that a single vehicle is straddled between lanes. A different threshold value may be used for logarithms in base 2, for example.

Although ampl1 and ampl2 may be the overall peak values of inductance change as the vehicle passes over the loops, there are advantages in using the peak value generated by the tractor unit of a semi trailer, for example, rather than later portions of the vehicle. This avoids using an unnecessarily high straddle threshold to deal with low-slung trailers, such as low-loaders and car transporters, which may give rise to very high amplitude inductance changes. The peak value induced by the tractor unit can be selected by picking a peak early in the overall signature, for example the highest level before there is significant activation on a subsequent loop along the carriageway (where a series of inductive loops are present). Alternatively, selection of the first peak that has around a 20% to 40% retracement of the inductance change plot after the peak (of the type seen in FIGS. 2 to 4) may be used to determine a notional peak value.

Additional means specific to motorcycles can be used when these are travelling adjacent to heavy goods vehicles, for example, since motorcycles give rise to anomalously low inductance change values. Motorcycles can be detected independently based on characteristics such as calculated length (due to time delay in passing over pairs of loops) and other measures.

In this embodiment, inductive loops are provided wholly within a lane, and processing measurements of inductance changes caused by a passing vehicle gives an indication of whether the vehicle was straddled between lanes at the loop site. In this case, a vehicle is deemed to be straddling if the sum of the logarithms is below a threshold values, and a non-straddling vehicle will have a sum above the threshold.

However, it will be appreciated that the loops could themselves be provided substantially straddled across lanes. In this case there would need to be a translation between the lateral space reference frame for the loops and the corresponding locations for the physical lanes.

Determining the Lateral Position of a Vehicle Straddling Lanes on the Carriageway If the vehicle had been determined not to be straddled between lanes, then the vehicle would be detected and counted as normal. If needed, a camera in the respective lane, such as those used for ANPR (automatic number plate recognition), can capture an image of a vehicle in order to obtain the license plate number.

However, if a vehicle is straddled between lanes as in the present scenario, it is necessary to determine which lane camera to use in order to capture an image of the vehicle. The lateral position of the vehicle in the lane affects this, and may be calculated based on the measured inductance change values using the following equation (3):

$$\text{location} = \frac{(\log(ampl1) - \log(ampl2)) * \text{lane\_width\_multiplier}}{\log(ampl1) + \log(ampl2) + \text{correction} * \text{multiplier}} \quad (3)$$

The value of the correction term above is determined using equation (2), and ampl1 and ampl2 are as defined above.

lane_width_multiplier is a value used to take account of the lateral spacing (i.e. distance) between centres of the adjacent loops used to measure inductance. The value can be approximately the same as the lane width.

multiplier The value of multiplier is chosen based on the value of factor used in calculating correction to provide a good correspondence between physical vehicle position and calculated position. For example, a value of multiplier 2.5 times greater than factor can work well in a standard site with 3.6 m to 3.75 m lane widths, e.g. a multiplier value of 7.5.

location is the approximate lateral position of a vehicle between two lanes, derived from equation (3). It is equivalent to the distance between a central plane of the vehicle (the plane running parallel with and along the lane) and the mid-line between two lanes.

The value of location can then be used, for example, to determine which camera in an array of cameras (focused on different lanes) should be used to capture a license plate picture of the vehicle.

Based on the above, and using the same inductance change values as in the earlier scenario, the value of location can be calculated as follows. In this case, lane_width_multiplier (the spacing between loop centres) is 3.6 metres, i.e. the full width of the lane, factor is 10, and multiplier is 25. Therefore:

$$\text{location} = \frac{(\log(ampl1) - \log(ampl2)) * \text{lane\_width\_multiplier}}{\log(ampl1) + \log(ampl2) + (\text{correction} * \text{multiplier})}$$

$$\text{location} = \frac{(\log(168) - \log(110)) * 3.6 \text{ m}}{\log(168) + \log(110) + \left(\frac{\log\left(\frac{168}{110}\right)}{10} * 25\right)}$$

$$\text{location} = 0.140 \text{ m } (3 \text{ s.f.})$$

This means that the centre of the vehicle is offset from the mid-line dividing the two lanes by around 14 cm, towards the lane with the larger inductance change value. Note that the width of the vehicle does not need to be known or estimated as it is not a factor in this equation.

The value of location can also be calculated in other ways, for example, using one of equations (3a) to (3c) below. Note that in (3a) width$_{factor}$ has a value of 0.6 m in this instance, having units of distance:

$$\text{location} = (\log(ampl1) - \log(ampl2)) * \text{width}_{factor} * \text{vehicle\_type}_{factor} \quad (3a)$$

$$\text{location} = (\log(168) - \log(110)) * 0.6 \text{ m} * 1$$

$$\text{location} = 0.110 \text{ m}$$

$$\text{location} = \left[\frac{\log(ampl1) - \log(ampl2) * (P * \text{correction})}{\log(ampl1) + \log(ampl2) + \text{correction}}\right] + \quad (3b)$$

$$\text{lane\_width\_multiplier}$$

$$\text{location} = \left[\frac{\log(168) - \log(110) * \left(0.5 * \frac{\log\left(\frac{168}{110}\right)}{10}\right)}{\log(168) + \log(110) + \frac{\log\left(\frac{168}{110}\right)}{10}}\right] * 1.8 \text{ m}$$

$$\text{location} = 0.081 \text{ m } (3 \text{ s.f.})$$

$$\text{location} = \frac{(\log(ampl1) - \log(ampl2)) *}{\frac{1}{\text{scale}} \log^{-1}\left[\frac{1}{2}(\log(ampl1) + \log(ampl2) + \text{correction})\right]} \quad (3c)$$

$$\text{location} = \frac{\log(168) - \log(110)}{\frac{1}{25} \log^{-1}\left[\frac{1}{2}\left(\log(168) + \log(110) + \frac{\log\left(\frac{168}{110}\right)}{10}\right)\right]}$$

$$\text{location} = 3.28\%$$

Equation (3c) produces a proportional value for location, rather than an absolute distance. In this case, for a vehicle straddled between lanes, its position is offset towards the loop where ampl1 was measured by around 3.3% of the lane width (3.6 m), which is around 0.12 metres.

The values selected for the various correction terms are exemplary only, and other values for the terms would lead to a more harmonised set of values for location. For example, P may take a value other than 0.5 in other embodiments. In any case, a variation of around 0.06 metres in location across the different calculations in equations (3) to (3c) demonstrates good agreement between the different approaches, and high accuracy relative to the size of the lanes and vehicles involved, particularly given that the values for the correction terms are only examples, and have not been refined.

Estimating a Theoretical In-Lane Inductance Change for a Vehicle

Where inductance change values are known for a vehicle straddled between two lanes, it is possible to subsequently determine an estimate for the inductance change value that would have been measured if the vehicle had instead been travelling centrally within a lane using the following equation (4):

$$ampl_{inline} = \frac{\log(ampl1) + \log(ampl2) + correction - factor1}{factor2}$$

The value of the correction term above is determined using equation (2), and ampl1 and ampl2 are as defined above.

factor1 is a value which may take account of lane width and/or vehicle characteristics such as vehicle width. The value of factor1 may correspond to the y-intercept of equation (4) when plotted graphically, due to the linear relationship between the sum of the logarithms of ampl1 and ampl2 and in lane amplitude. Typical values of factor1 are between 3.3 and 3.8, with wider vehicles (such as heavy goods vehicles or buses) at the same site using a value typically 0.2 or 0.3 less than this, to mitigate over-estimation of $ampl_{inline}$ for these vehicles. Changing the value of factor1 is not required for some purposes, for example where over-estimation of in-lane amplitude for heavy vehicles does not adversely impact performance. The values given are those used where a carriageway has standard lane widths.

factor2 is a value which scales the sum of the logarithms of ampl1 and ampl2 to typical vehicle detection amplitudes. For example, it may typically increase the output value by a factor of around 1000 to 2000. The value of factor2 affects the gradient of equation (4) when plotted graphically. Typical values of factor2 are between 0.0005 and 0.001, although other values may be used depending on loop site configuration.

$ampl_{inline}$ is an inductance change value corresponding to the vehicle for which values of ampl1 and ampl2 were measured. The value of $ampl_{inline}$ is an estimation of the inductance change value that would be measured if that vehicle were to traverse the loop centrally, i.e. the centre of the vehicle passing over the centre of the inductive loop in question.

Values for factor1 and factor2 can be determined in various ways. One approach is to collect statistical data on the road in which an inductive loop apparatus is installed, using initial or default values for factor1 and factor2. The initial/default values may be represented as $f1_{deflt}$ and $f2_{deflt}$ respectively, although other notation can be used. For example, $f1_{deflt}$ might be set to 3.6 and $f2_{deflt}$ might be set to 0.0007. The values chosen for this step are not especially critical.

Using these default values, data can be collected for a sample of vehicles in normal traffic conditions, and used to derive means and standard deviations. For example, mean and standard deviation values for the following can be derived:

a) The amplitudes of vehicles travelling substantially in lane, i.e. not straddled between lanes (deriving $mean_{inlane}$, $sd_{inlane}$);
b) Values for [log(ampl1)+log(ampl2)+correction] for straddling vehicles as calculated using equation (1) (deriving $mean_{strad}$);
c) The calculated in lane amplitudes for vehicles straddled between lanes, calculated in accordance with equation (4), using the default values chosen for factor1 and factor2 (deriving $mean_{calc}$, $strad_{calc}$).

The values of factor2 and factor1 can be calculated as:

$$factor2 = \frac{sd_{calc}}{sd_{inlane}} * f2_{deflt} \tag{5}$$

$$factor1 = \frac{mean_{strad} - ((mean_{strad} - f1_{deflt}) * factor2)}{f1_{deflt} * \frac{mean_{calc}}{mean_{inlane}}} \tag{6}$$

In this embodiment, for equation (6) factor2 takes the value calculated in equation (5).

Processing the default values of factor1 and factor2 using the above calculations refines each value for that particular loop site, improving the accuracy of the calculated theoretical inductance change value $ampl_{inline}$. For example, if $f2_{deflt}$ is 0.0007, factor2 may end up being around 0.00057.

Although means and standard deviations of inductance change values are used to calculate factor1 and factor2, these are not the only statistics which may be used. It will be appreciated that substantially equivalent calculations could be performed utilising values for medians and interquartile ranges of the data, instead of means and standard deviations.

Sufficient vehicles should be included in the data collection so that the confidence limits for the statistics are adequately small to produce good estimates for factor1 and factor2.

In most sites installed with a loop apparatus, all of the lanes in a roadway which may have vehicles straddled between them are of substantially uniform width and construction. In these cases, the data for all straddling events collected can be aggregated to produce overall statistics and calculate a single pair of factor1 and factor2 values which can then be used for all straddling vehicles. This applies irrespective of the lanes that the vehicles are straddled across.

In cases where there are substantial differences in lane widths across the roadway, or in loop widths or lateral loop separation distances, it may be appropriate to calculate separate factor1 and factor2 values for each pair of adjacent lanes.

This method of determining factor1 and factor2 relies on the number and type of vehicles straddling lanes being substantially similar to the number and type of vehicles travelling in lane, which is generally true. However, in some situations, vans or trucks may be filtering into a particular lane, for example, which can bias the statistical data. Therefore, the vehicle samples should be checked to assess whether the resulting values for factor1 and factor2 are likely to be reliable. It may be necessary to adjust the samples of vehicles to avoid a substantial mismatch, which could otherwise significantly alter the in lane statistics.

The standard deviation for amplitudes of vehicles travelling in lane may be increased by vehicles travelling slightly offset to one side or the other of the loops, but not sufficiently offset for adjacent loop activation. Using a value for $sd_{inlane}$ slightly less than that derived from the data may lead to slightly more accurate calculated in lane values. A reduction of between 10% and 20% may be used depending on the level of lane discipline observed for the sample.

Alternatively, values for factor1 and factor2 can be obtained in a test configuration by running a sample of vehicles fully over the loops and straddling between them, and measuring the in-lane amplitudes. The corresponding straddling logarithm values (and correction, where used) can then be calculated. Plotting the in-lane amplitudes against the logarithm sums allows a value for the slope (for factor2) and intercept value (for factor1) to be obtained from the plot by inspection, or by application of a suitable regression calculation.

The values of factor1 and factor2 may be determined experimentally for a given site, particularly where the lanes and/or inductive loops of a carriageway differ significantly. For example, if there are different lane widths, or significant rebar effects, the values may differ from those given above. Vehicles with different chassis heights can be used to gather inductance change value data and select optimal values for factor1 and factor2 in such cases.

Note that wide vehicles can be identified with sufficient accuracy from the structure of the inductance change value over time as the vehicle passes over an inductive loop. They can also be identified via axle detectors, where these are used, since heavier vehicles produce higher axle detection amplitudes for most forms of axle detector.

For example, using the same inductance change values as in the earlier scenario, the value of $ampl_{inline}$ can be calculated as follows. In this case, factor1 is 3.76 and factor2 is 0.000568, and factor (for calculating correction) is 10. Therefore:

$$\frac{\log(168) + \log(110) + [(\log(168/110))/10] - 3.76}{0.000568} = 924 (3\ s.f)$$

Note that the outputs from the inductive loops for a particular vehicle type can vary in amplitude in response to such factors as loop sensitivity, loop size, the presence and proximity of ferrous or conducting reinforcing materials in the pavement, and the length of lead-ins, amongst other factors. The described calculations work best when the vehicle detection amplitudes are standardised. It is common practice to standardise detection amplitudes to values of around 1300 for a typical sedan car, and the figures may be based around that standard response.

The skilled person will appreciate that it is assumed that the loops in the system are all of the same size and are situated in magnetically uniform pavement. In the unusual event that the site is significantly laterally non-uniform, adjustments may be needed to some of the parameters if very accurate lateral locations are required. Further, it is assumed that the activations for all loops are scaled before use in any of the methods so that they would be the same for any given vehicle travelling over them.

The skilled person will also appreciate that mathematical rearrangement and/or redistribution of terms in the above equations would give rise to substantially equivalent equations within the scope of the claims. In particular, rearrangement of the logarithms to combine or expand them—for subsequent factorisation of other terms, for example—is considered to give rise to substantially equivalent equations. Similarly, including, altering or omitting terms of negligible magnitude, factors which have minimal effect on the resulting value, and/or selected mathematical sign inversions would also give substantially equivalent equations. Where standard deviations are used, using a value derived from the variance of the sample is an alternative.

Any combination of correction terms, such as those presented above, may be applied to the numerator and/or the denominator, in calculations where these are present. Correction terms may be applied as operators involving addition, subtraction, multiplication, or division, amongst others.

Although the invention is described in terms of lanes on a carriageway, the apparatus of the invention is applicable in any system where the lateral position of a vehicle needs to be determined as it moves along a road, irrespective of lane markings. It will be appreciated that the calculations described may be modified to take into account inductive loops of different lengths and/or widths.

The embodiments described above are provided by way of example only, and various changes and modifications will be apparent to persons skilled in the art without departing from the scope of the present invention as defined by the appended claims.

The invention claimed is:

1. A method of assessing whether a vehicle is straddled between lanes on a multi-lane carriageway, the method comprising the steps of
   a) measuring inductance change values from two adjacent inductive loops situated at a loop site, as the vehicle traverses the loop site;
   b) summing separate logarithms of the inductance change values, or taking a logarithm of the product of the inductance change values, to obtain a value; and
   c) comparing the value from step (b) against a predetermined threshold value to make a determination as to whether:
      i) a single vehicle is straddling multiple lanes, where the value from step (b) is on one side of the predetermined threshold value, or
      ii) two vehicles are present in adjacent lanes, where the value from step (b) is on the other side of the predetermined threshold value.

2. The method of claim 1, wherein steps (b) and (c) involve using a calculation, the calculation being substantially equivalent to straddling value = $\log(ampl1) + \log(ampl2)$ or straddling value = $\log(ampl1) + \log(ampl2)$ + correction where ampl1 and ampl2 are measured inductance change values, and a magnitude of the straddling value is an indicator of whether the vehicle is straddling lanes, and correction is a correction term which may be calculated using a calculation substantially equivalent to $$\text{correction} = \frac{\log\left(\frac{ampl1}{ampl2}\right)}{\text{factor}}$$

or $$\text{correction} = \frac{\log\left(\frac{\max(ampl1,\, ampl2)}{\min(ampl1,\, ampl2)}\right)}{\text{factor}}$$

where factor is a scaling term.

3. The method of claim 1, further including the step of modifying the calculated logarithm or logarithms of step (b) with at least one correction term, in which the correction term is derived by:
  I) obtaining a ratio of i) the inductance change value of one inductive loop relative to the inductance change value of the other inductive loop, or ii) the greater inductance change value to the lesser inductance change value;
  II) calculating a logarithm of the ratio; and
  III) using a further term to modify the calculated logarithm of step (II).

4. A vehicle detection apparatus for assessing whether a vehicle is straddled between lanes on a multi-lane carriageway, the apparatus comprising
  a loop site including two inductive loops, provided on or in adjacent lanes of the carriageway,
  a loop controller associated with each inductive loop, each loop controller energising its associated loop, and measuring inductance change values in that loop when the vehicle traverses the loop site; and
  processing means for receiving the inductance change values from the loop controllers, and adapted to establish a calculated value by:
    a) taking logarithms of each inductance change value, and summing the logarithms; or
    b) taking a product of the inductance change values, and taking the logarithm of that product;
  the processing means being further adapted to compare the calculated value against a predetermined threshold value, and make a determination as to whether the inductance change values relate to:
    i) a single vehicle straddling multiple lanes, where the calculated value is on one side of the predetermined threshold value; or
    ii) two vehicles present in adjacent lanes, where the calculated value is on the other side of the predetermined threshold value.

5. A method of estimating the lateral position of a vehicle substantially straddled between lanes on a multi-lane carriageway, the method comprising the steps of:
  a) measuring inductance change values from two adjacent inductive loops situated at a loop site, as a vehicle traverses the loop site;
  b) establishing logarithms of the inductance change values;
  c) taking the difference between the logarithms of step (b); thereby obtaining an estimate related to the lateral position of the vehicle on the carriageway.

6. The method of claim 5, wherein steps (b) and (c) involve using a relationship substantially equivalent to $$\text{location} \propto (\log(ampl1) - \log(ampl2))$$

where ampl1 and ampl2 are measured inductance change values, and location relates to the lateral position of the vehicle on the carriageway.

7. The method of claim 5, further including the steps of:
  d) combining the logarithms of step (b) to establish a combined value;
  e) establishing a ratio of the difference of step (c) to the combined value of step (d).

8. The method of claim 7, wherein steps (b) to (e) involve using a calculation substantially equivalent to $$\text{location} = \frac{\log(ampl1) - \log(ampl2)}{\log(ampl1) + \log(ampl2)}$$

where ampl1 and ampl2 are measured inductance change values, and location relates to the lateral position of the vehicle on the carriageway.

9. The method of claim 5, wherein the difference of the logarithms in step (c) is modified by one or more correction terms, and the relationship is substantially equivalent to $$\text{location} = (\log(ampl1) - \log(ampl2)) * \text{width}_{factor} * \text{vehicle\_type}_{factor}$$

where $\text{width}_{factor}$ and $\text{vehicle\_type}_{factor}$ are correction terms.

10. The method of claim 5, wherein the difference of the logarithms in step (c) is modified by one or more correction terms, and the calculation is substantially equivalent to one of equations (A) to (F):

$$\text{location} = \frac{(\log(ampl1) - \log(ampl2)) * \text{lane\_width\_multiplier}}{\log(ampl1) + \log(ampl2)} \quad \text{A)}$$

where lane_width_multiplier is one of the correction terms;

$$\text{location} = \frac{(\log(ampl1) - \log(ampl2)) * \text{lane\_width\_multiplier}}{\log(ampl1) + \log(ampl2) + (\text{correction} * \text{multiplier})} \quad \text{B)}$$

where correction, lane_width_multiplier and multiplier are correction terms;

$$\text{location} = \frac{\log(ampl1) - \log(ampl2) + \text{correction}}{\log(ampl1) + \log(ampl2) + \text{correction}} \quad \text{C)}$$

where correction is one of the correction terms;

$$\text{location} = \left[\frac{\log(ampl1) - \log(ampl2) + (P * \text{correction})}{\log(ampl1) + \log(ampl2) + \text{correction}}\right] * \text{lane\_width\_multiplier} \quad \text{D)}$$

where P, correction and lane_width_multiplier are correction terms;

$$\text{location} = \frac{\log(ampl1) - \log(ampl2)}{\frac{1}{\text{scale}} \log^{-1}\left[\frac{1}{2}(\log(ampl1) + \log(ampl2))\right]} \quad \text{E)}$$

where scale is one of the correction terms; or $$\text{location} = \frac{\log(ampl1) - \log(ampl2)}{\frac{1}{\text{scale}}\log^{-1}\left[\frac{1}{2}(\log(ampl1) + \log(ampl2)) + \text{correction}\right]} \quad \text{F)}$$

where scale and correction are correction terms.

11. The method of claim 10, wherein one of the correction terms, such as correction, is derived by:
I) obtaining a ratio of i) the inductance change value of one inductive loop relative to the inductance change value of the other inductive loop, or ii) the greater inductance change value to the lesser inductance change value;
II) calculating a logarithm of the ratio; and
III) using a further term, such as a scaling term, to modify the calculated logarithm.

12. A vehicle detection apparatus for estimating the lateral position of a vehicle substantially straddled between lanes on a multi-lane carriageway, the apparatus comprising
a loop site including two inductive loops provided adjacent to one another on or in the carriageway,
a loop controller associated with each inductive loop, each loop controller energising its associated loop, and measuring inductance change values in that loop when the vehicle traverses the loop site; and
processing means for receiving the inductance change values from the loop controllers, and adapted to establish an estimate of the lateral position of the vehicle on the carriageway by:
a) taking logarithms of the inductance change values, and taking a difference of those logarithms; or
b) establishing a ratio of the inductance change values, and taking a logarithm of the ratio.

13. The apparatus of claim 12, wherein the processing means is further adapted to modify the output from (a) or (b), and/or (c), with at least one correction term when establishing the estimate of lateral position, and the correction term or terms are based on one or more of the following: a logarithm of the ratio of the inductance change values; the distance between the inductive loops; the distance between centres of the inductive loops; lane widths on the carriageway; materials that form part of the carriageway at the loop site; vehicle type.

14. A method of estimating an inductance change value that would arise for a vehicle travelling centrally over a given inductive loop in a carriageway, the method comprising the steps of:
a) measuring inductance change values from two adjacent inductive loops situated at a loop site, as the vehicle traverses the loop site;
b) establishing one or more logarithms of the inductance change values;
c) applying first and second correction terms to the one or more logarithms to establish an estimated inductance change value that would have arisen in one of the inductive loops if the vehicle had travelled substantially centrally over that loop.

15. The method of claim 14, wherein steps (b) and (c) involve using a calculation substantially equivalent to $$ampl_{inline} = \frac{\log(ampl1) + \log(ampl2) - factor1}{factor2}$$

or $$ampl_{inline} = \frac{\log(ampl1) + \log(ampl2) + \text{correction} - factor1}{factor2}$$

where ampl1 and ampl2 are measured inductance change values, factor1 and factor2 are correction terms, and $ampl_{inline}$ is an estimated theoretical inductance change value, and correction is a further correction term which may be calculated by using a calculation substantially equivalent to $$\text{correction} = \frac{\log\left(\frac{ampl1}{ampl2}\right)}{factor}$$

or $$\text{correction} = \frac{\log\left(\frac{\max(ampl1, ampl2)}{\min(ampl1, ampl2)}\right)}{factor}$$

where factor is scaling term.

16. The method of claim 14, wherein a further correction term is applied to the one or more logarithms, the further correction term being derived by:
I) obtaining a ratio of i) the inductance change value of one inductive loop relative to the inductance change value of the other inductive loop, or ii) the greater inductance change value to the lesser inductance change value;
II) calculating a logarithm of the ratio;
III) applying a correction to the calculated logarithm.

17. The method of claim 15, further including the step of determining factor2 by
i) collecting sets of inductance change values for the vehicles travelling substantially in lane during normal traffic conditions on the carriageway;
ii) collecting further sets of inductance change values for vehicles straddled between lanes during normal traffic conditions on the carriageway;
iii) setting an initial value for factor2, and calculating an $ampl_{inline}$ value for each further set of inductance change values; and
iv) using the initial value of factor2 to derive a refined value of factor2 via a calculation substantially equivalent to $$factor2_{n+1} = \frac{sd_{calc}}{sd_{inlane}} * factor2_n$$

where $factor2_n$ is the initial value of factor2 from (iii), $sd_{inlane}$ is the standard deviation of the values in the sets of inductance change values in (i), $sd_{calc}$ is the standard deviation of the $ampl_{inline}$ values from (iii), and $factor2_{n+1}$ is the refined value of factor2.

18. The method of claim 17, further including the step of determining factor1 by
v) calculating logarithms for each set and further set of inductance change values;
vi) using one or more correction terms to modify the logarithms of each set of inductance change values; and
vii) using an initial value of factor1 to derive a refined value of factor1 via a calculation substantially equivalent to $$factor1_{n+1} = \frac{mean_{strad} - ((mean_{strad} - factor1_n) * factor2)}{factor1_n * \frac{mean_{calc}}{mean_{inlane}}}$$

where $factor1_n$ is the initial value of factor1, $mean_{strad}$ is the mean of the values of the modified logarithms in (vi), $mean_{calc}$ is the mean of the $ampl_{inline}$ values from (iii), $mean_{inlane}$ is the mean of the values in the sets of inductance change values in (i), and $factor1_{n+1}$ is the refined value of factor1.

19. A vehicle detection apparatus for estimating an inductance change value that would arise for a vehicle travelling centrally over a given inductive loop in a carriageway, the apparatus comprising:

a loop site including at least two inductive loops provided adjacent to one another on or in the carriageway, a loop controller associated with each inductive loop, each loop controller energising its associated loop, and measuring inductance change values in that loop when the vehicle traverses the loop site; and processing means for receiving the inductance change values from the loop controllers, and adapted to establish an estimate of the inductance change value that would have arisen for one of those inductive loops had the vehicle travelled centrally over that loop by: summing logarithms of the inductance change values, and applying one or more correction terms to the summed logarithms to establish the estimate.

20. The apparatus of claim 19, wherein the processing means is further adapted to use statistics related to the inductance change values to refine the values of the first and/or second correction factors, before applying the correction factors to the logarithms.

\* \* \* \* \*